(12) United States Patent
Chang

(10) Patent No.: US 9,025,337 B2
(45) Date of Patent: May 5, 2015

(54) WIRELESS MODULE AND CONNECTOR APPARATUS HAVING THE SAME

(71) Applicant: Nai-Chien Chang, New Taipei (TW)

(72) Inventor: Nai-Chien Chang, New Taipei (TW)

( * ) Notice: Subject to any disclaimer, the term of this patent is extended or adjusted under 35 U.S.C. 154(b) by 199 days.

(21) Appl. No.: 13/758,473

(22) Filed: Feb. 4, 2013

(65) Prior Publication Data

US 2013/0286602 A1 Oct. 31, 2013

(30) Foreign Application Priority Data

Apr. 26, 2012 (TW) .............................. 101207834 U

(51) Int. Cl.
*H05K 7/02* (2006.01)
*H04B 1/38* (2006.01)
*G06F 1/16* (2006.01)

(52) U.S. Cl.
CPC .................. *H05K 7/026* (2013.01); *H04B 1/38* (2013.01); *H04B 1/3888* (2013.01); *G06F 1/1698* (2013.01)

(58) Field of Classification Search
USPC ............ 361/679.01, 749, 752, 679.31, 679.3, 361/622, 679.02, 679.09, 748, 67, 9.26, 361/679.55, 679.08, 679.4, 679.41, 679.56, 361/814, 733, 736, 119, 728; 29/592.1, 29/829, 832, 600, 729, 854, 876; 439/374, 439/377, 620.01, 638, 65, 656, 660, 620.22, 439/541.5, 55, 620.15, 76.1, 79, 83, 929, 439/218, 540.1, 607.35, 620.17, 620.18, 439/620.21, 620.23, 620.24, 626, 64, 74, 78
See application file for complete search history.

(56) References Cited

U.S. PATENT DOCUMENTS

| | | | | |
|---|---|---|---|---|
| 6,328,603 | B1 * | 12/2001 | Chang | 439/620.19 |
| 6,702,618 | B1 * | 3/2004 | Hyland et al. | 439/620.23 |
| 7,699,624 | B2 * | 4/2010 | Muramatsu | 439/76.2 |
| 7,905,750 | B2 * | 3/2011 | Mo | 439/541.5 |
| 8,437,710 | B2 * | 5/2013 | Mo | 455/91 |
| 2010/0155489 | A1 * | 6/2010 | Chang | 235/486 |
| 2010/0159748 | A1 * | 6/2010 | Chang | 439/620.22 |
| 2012/0051024 | A1 * | 3/2012 | Mo | 361/814 |
| 2012/0108190 | A1 * | 5/2012 | Mo | 455/128 |

* cited by examiner

*Primary Examiner* — Hung S Bui
*Assistant Examiner* — Michael Matey
(74) *Attorney, Agent, or Firm* — Muncy, Geissler, Olds & Lowe, P.C.

(57) ABSTRACT

A wireless module includes a wireless signal transceiver and a transferring unit. The wireless module is assembled to a connector unit after the wireless signal transceiver is assembled to the transferring unit. Therefore, the connector unit transmits and receives wireless signals through the wireless module.

15 Claims, 10 Drawing Sheets

WIRELESS MODULE AND CONNECTOR APPARATUS HAVING THE SAME

This application is based on and claims priority from Taiwan Application No. 101207834, filed Apr. 26, 2012, the disclosure of which is hereby incorporated by reference herein in its entirety.

BACKGROUND OF THE INVENTION

1. Field of the Invention

The present invention relates to a module and a connector apparatus, and especially relates to a wireless module and a connector apparatus having the wireless module.

2. Description of the Related Art

The technology is progressing every day. Wireless modules for transmitting-receiving wireless signals are built-in the portable electronic devices (for example, a notebook, a tablet PC, a smart phone, a satellite navigator, and so on).

In order to arrange the wireless module into the casing of the electronic device, the volumes of the printed circuit board or the monitor of the electronic device are reduced. Therefore, the wireless module would be arranged in the space between the casing and the printed circuit board or the monitor. The signal processing module for processing transmitting-receiving signals are mounted on the printed circuit board of the electronic device. The volume of the antenna module has to be reduced if the space between the casing and the printed circuit board or the monitor is small. However, in order not to affect the performance of transmitting-receiving wireless signals, designing the antenna will be difficult if the volume of the antenna is to be reduced.

Wireless signals transmitted or received by the antenna would be affected by the electromagnetic waves from the printed circuit board or the monitor since the antenna is arranged in the space between the casing and the printed circuit board or the monitor. Therefore, in order to reduce the electromagnetic waves interference, the structure for reducing the electromagnetic waves would be arranged in the space where the antenna module is arranged. Moreover, the external antenna would be used if the performance of the structure for reducing the electromagnetic waves is not good. However, some external antennas are arranged outside the casing of the electronic device. It is inconvenient for using or carrying.

SUMMARY OF THE INVENTION

In order to solve the above-mentioned problems, an object of the present invention is to provide a wireless module and a connector apparatus having the wireless module. The wireless module includes a wireless signal transceiver and a transferring unit. The connector apparatus includes the wireless module and a connector unit. The wireless signal transceiver is electrically connected to the connector unit through the transferring unit. Because the wireless module is on the top of the connector unit, the wireless module is not affected by the electromagnetic waves, and the performance of transmitting-receiving wireless signals will be better.

In order to achieve the object of the present invention mentioned above, the wireless module includes the wireless signal transceiver and the transferring unit. The wireless signal transceiver includes a first printed circuit board, a wireless signal processing chip, and a first connector. The wireless signal processing chip and the first connector are mounted on the first printed circuit board. The first connector is electrically connected to the wireless signal processing chip. The transferring unit includes a second printed circuit board, a second connector, and a plurality of signal transmission parts. The second connector is mounted on the second printed circuit board and is electrically connected to the first connector. The signal transmission parts are electrically connected to one side of the second printed circuit board.

Moreover, the wireless signal processing chip is a wireless fidelity (Wi-Fi) signal processing chip or a Bluetooth signal processing chip. The wireless signal transceiver further includes a first antenna connector mounted on the first printed circuit board. The first antenna connector is electrically connected to the wireless signal processing chip. The transferring unit further includes a transferring connector electrically connected to the first antenna connector. The transferring connector is mounted on the second printed circuit board or is electrically connected to the second printed circuit board through a transmission wire of the transferring unit. The transferring unit further includes a second antenna connector mounted on another side of the second printed circuit board. The transferring unit further includes a plurality of antennas electrically connected to the second printed circuit board. The antenna is a planar inverted f antenna (PIFA). The signal transmission parts are conductive pins or a bus. The wireless module further includes a casing covering the wireless signal transceiver and the transferring unit. The signal transmission parts are extended outside the casing. The wireless module further includes an external antenna. The external antenna includes a pivot axis, a radiator, and a cable line. The pivot axis is pivotally jointed to the casing. The radiator is electrically connected to the second antenna connector through the cable line.

In order to achieve the object of the present invention mentioned above, the connector apparatus includes the wireless module and the connector unit. The connector unit includes at least an electrical connector and a housing. The electrical connector is arranged in the housing. The housing includes a groove on the top of the housing. The wireless module is assembled to the groove. The wireless module includes a wireless signal transceiver and a transferring unit. The wireless signal transceiver includes a first printed circuit board, a wireless signal processing chip, and a first connector. The wireless signal processing chip and the first connector are mounted on the first printed circuit board. The first connector is electrically connected to the wireless signal processing chip. The transferring unit includes a second printed circuit board, a second connector, and a plurality of signal transmission parts. The second connector is mounted on the second printed circuit board and is electrically connected to the first connector. The signal transmission parts are electrically connected to one side of the second printed circuit board.

Moreover, the wireless signal processing chip is a wireless fidelity (Wi-Fi) signal processing chip or a Bluetooth signal processing chip. The wireless signal transceiver further includes a first antenna connector mounted on the first printed circuit board. The first antenna connector is electrically connected to the wireless signal processing chip. The transferring unit further includes a transferring connector electrically connected to the first antenna connector. The transferring connector is mounted on the second printed circuit board or is electrically connected to the second printed circuit board through a transmission wire of the transferring unit. The transferring unit further includes a second antenna connector mounted on another side of the second printed circuit board. The transferring unit further includes a plurality of antennas electrically connected to the second printed circuit board. The antenna is a planar inverted f antenna (PIFA). The signal transmission parts are conductive pins or a bus. The wireless module further includes a casing covering the wireless signal transceiver and the transferring unit. The signal transmission parts are extended outside the casing. The wireless module further includes an external antenna. The external antenna includes a pivot axis, a radiator, and a cable line. The pivot axis is pivotally jointed to the casing. The radiator is electrically connected to the second antenna connector through the cable line. The connector unit further includes a metal shell covering the housing. The groove includes a plurality of via holes. The conductive pins are extended outside the bottom of the housing through the via holes. The housing further includes two hook-shaped positioning parts. The positioning parts are arranged on walls of the groove. The wireless module is assembled to the groove through the positioning parts. The connector unit further includes a plurality of the electrical connectors stacked with each other. The electrical connector is one of a universal serial bus (USB) connector, a high definition multimedia interface (HDMI) connector, a displayport connector, a PS/2 connector, an external serial advanced technology attachment (eSATA) connector, a micro universal serial bus (micro-USB) connector, a mini universal serial bus (mini-USB) connector, and an institute of electronical and electronic engineers 1394 (IEEE 1394) connector.

DETAILED DESCRIPTION OF THE INVENTION

Figure 1:
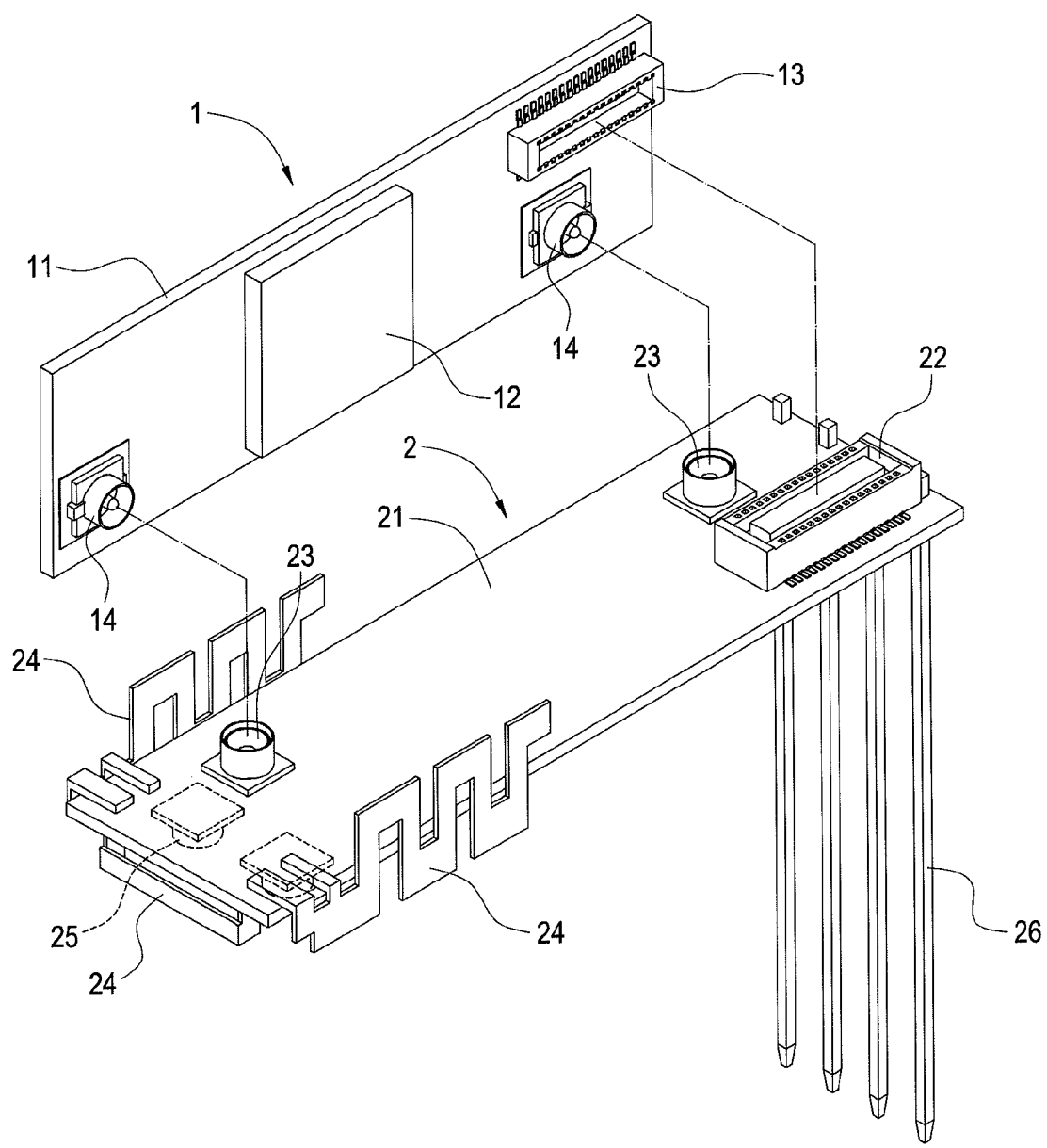
FIG. 1 shows an exploded view of the wireless module of the present invention.
Figure 2:
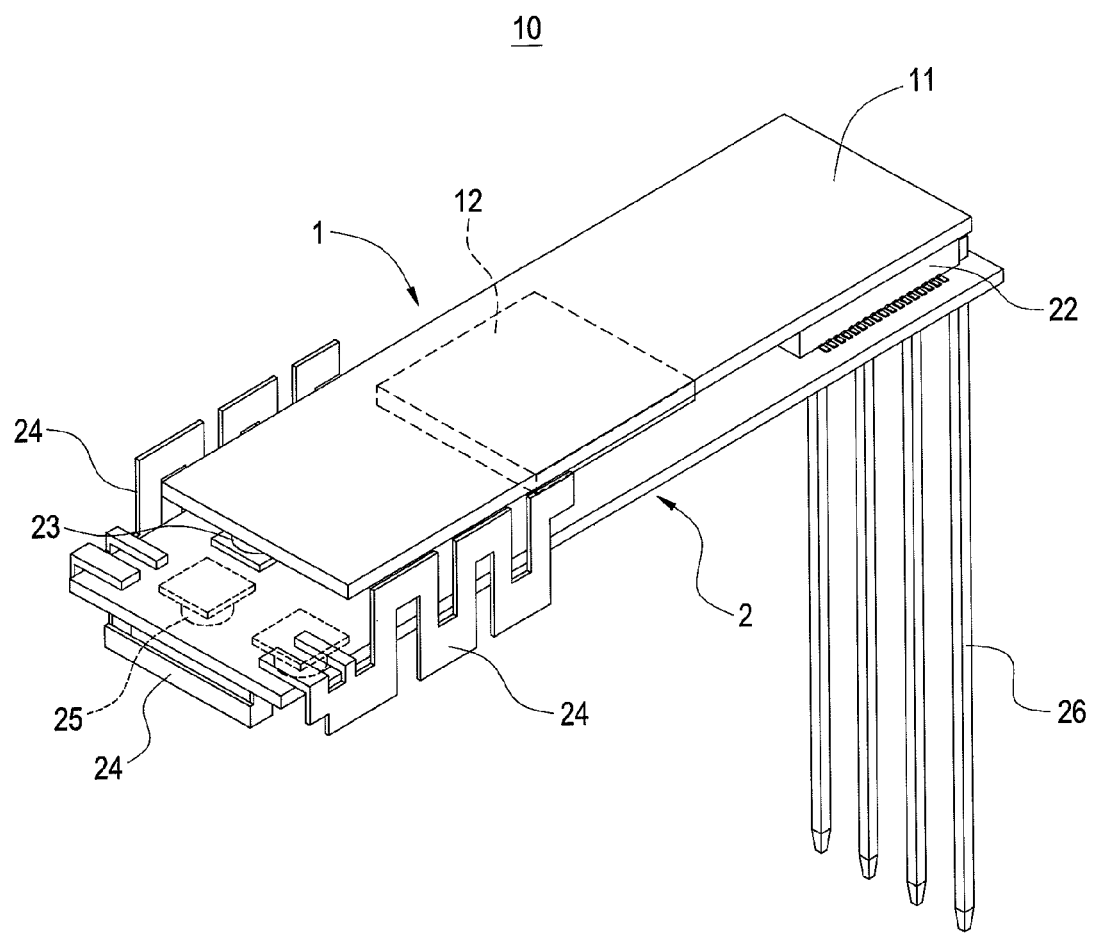
FIG. 2 shows an assembly diagram of the wireless module of the present invention.

FIG. 1 shows an exploded view of the wireless module of the present invention. FIG. 2 shows an assembly diagram of the wireless module of the present invention. A wireless module 10 includes a wireless signal transceiver 1 and a transferring unit 2.

The wireless signal transceiver 1 includes a first printed circuit board 11, a wireless signal processing chip 12, a first connector 13, and at least a first antenna connector 14. The wireless signal processing chip 12, the first connector 13, and the first antenna connector 14 are mounted on the first printed circuit board 11. The wireless signal processing chip 12 is a wireless fidelity (Wi-Fi) signal processing chip or a Bluetooth signal processing chip. The first connector 13 and the first antenna connector 14 are electrically connected to the wireless signal processing chip 12.

The transferring unit 2 includes a second printed circuit board 21, a second connector 22, and at least a transferring connector 23. The second connector 22 is mounted on the second printed circuit board 21 and is electrically connected to the first connector 13. The transferring connector 23 is mounted on the second printed circuit board 21 and is electrically connected to the first antenna connector 14. The transferring unit 2 further includes a plurality of antennas 24 which have different patterns and are electrically connected to the second printed circuit board 21. The transferring unit 2 further includes at least a second antenna connector 25 mounted on one side of the second printed circuit board 21. The second antenna connector 25 is used for connecting an external antenna (not shown in FIG. 1 and FIG. 2).

Moreover, the transferring unit 2 further includes a plurality of signal transmission parts 26 electrically connected to another side of the second printed circuit board 21. Signals will be transmitted through the signal transmission parts 26. In FIG. 1 and FIG. 2, the antenna 24 is a planar inverted f antenna (PIFA). The signal transmission parts 26 are conductive pins or a bus.

Figure 3:
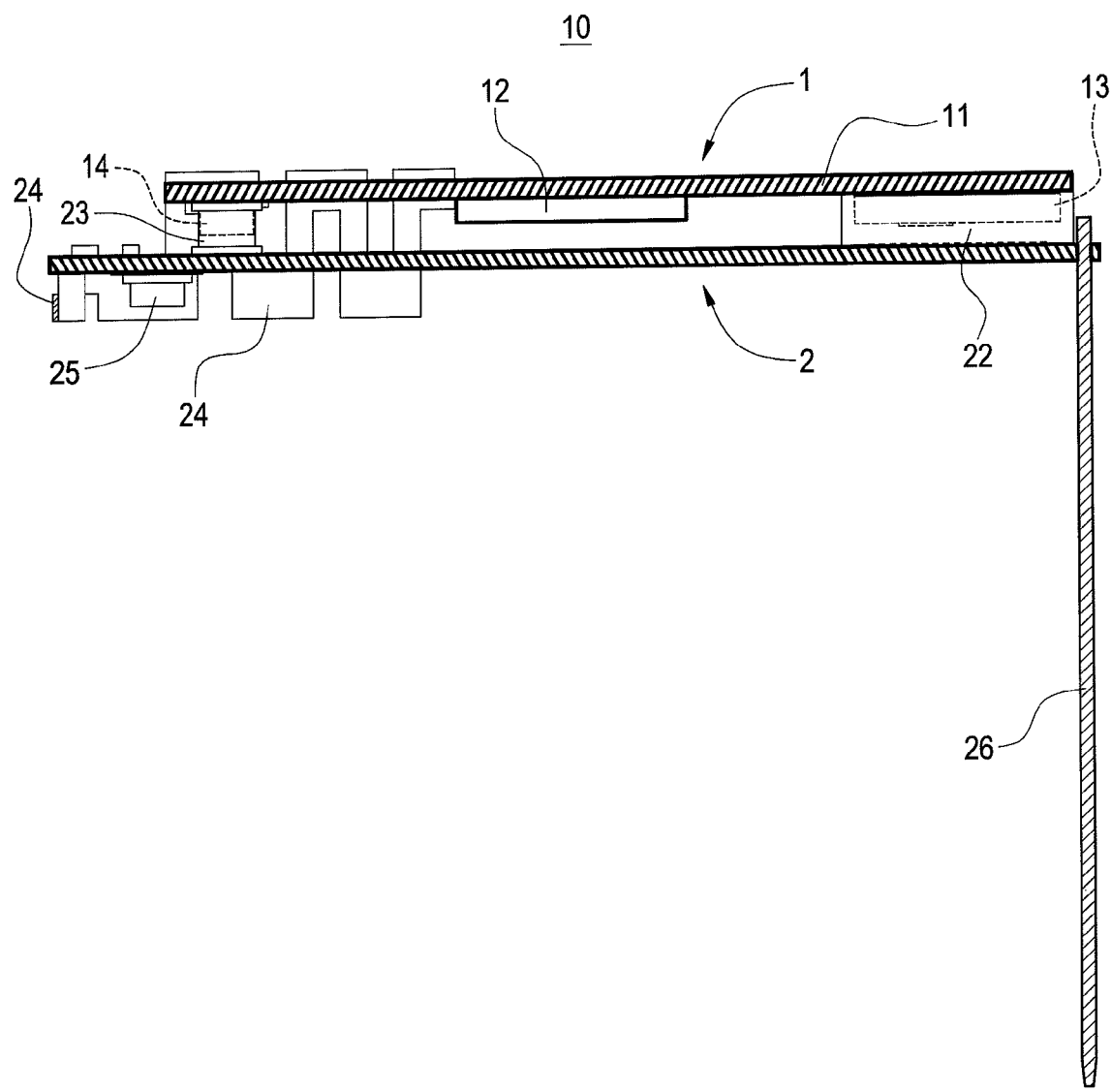
FIG. 3 shows a side view of the wireless module of the present invention.

FIG. 3 shows a side view of the wireless module of the present invention. Please refer to FIG. 2 as well. After the wireless signal transceiver 1 is assembled to the transferring unit 2, the first connector 13 is connected to the second connector 22, and the first antenna connector 14 is connected to the transferring connector 23. Signals received by the antenna 24 or the external antenna connected to the second antenna connector 25 are transmitted to the first antenna connector 14 through the second printed circuit board 21 and the transferring connector 23. Then, the signals are transmitted from the first antenna connector 14 to the wireless signal processing chip 12 for processing the signals through the first printed circuit board 11. Finally, the signals are transmitted from the wireless signal processing chip 12 to a mainboard (not shown in FIG. 2 and FIG. 3) of an electronic device (not shown in FIG. 2 and FIG. 3) through the first printed circuit board 11, the first connector 13, the second connector 22, the second printed circuit board 21, and the signal transmission parts 26.

On the contrary, the signals are transmitted from the mainboard to the second connector 22 through the signal transmission parts 26 and the second printed circuit board 21 after the signals are processed by the mainboard. Then, the signals are transmitted from the second connector 22 to the wireless signal processing chip 12 for processing the signals through the first connector 13 and the first printed circuit board 11. Finally, the signals are wirelessly transmitted by the antenna 24 or the external antenna connected to the second antenna connector 25 through the wireless signal processing chip 12, the first printed circuit board 11, the first antenna connector 14, the transferring connector 23, and the second printed circuit board 21.

Figure 4:
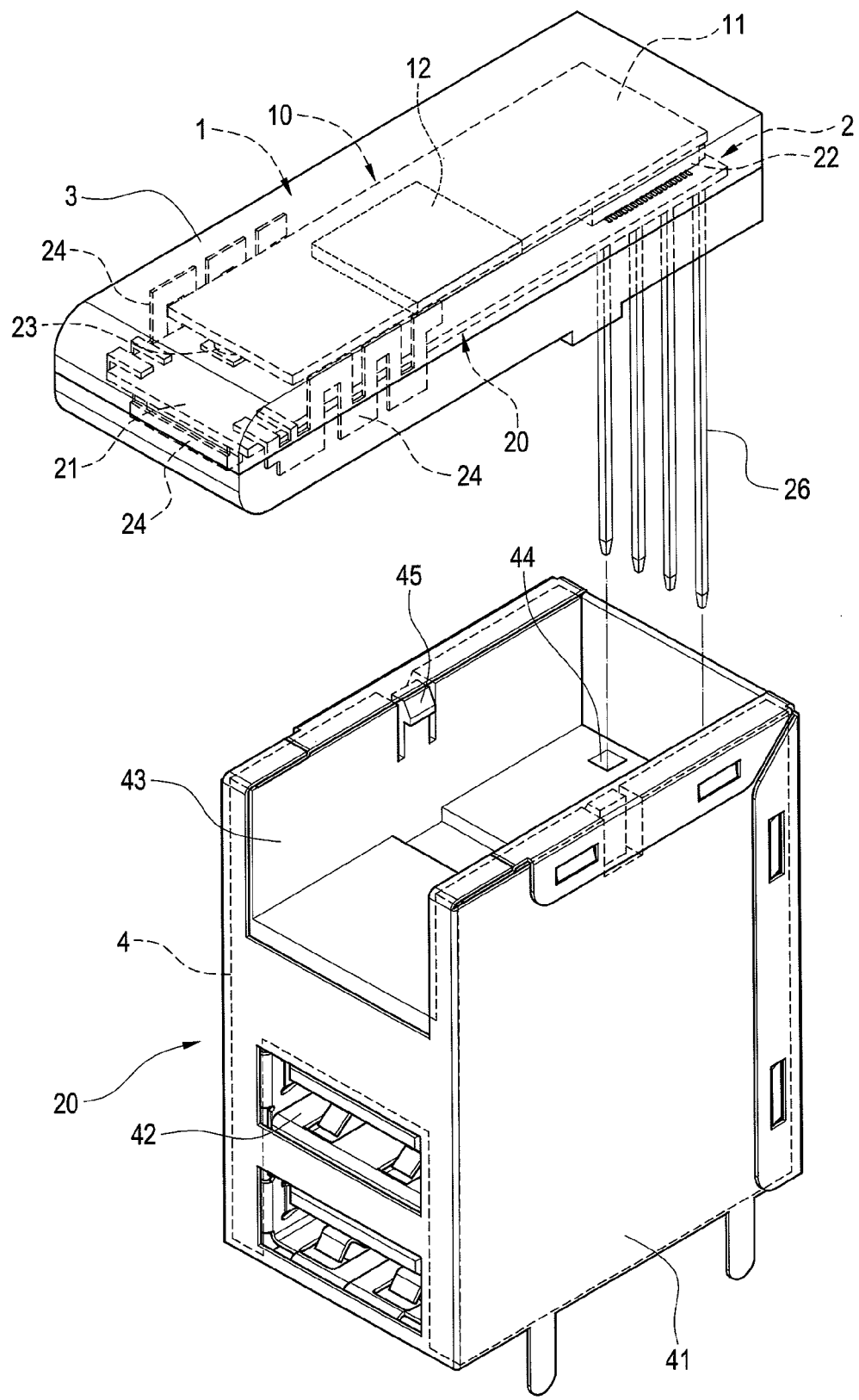
FIG. 4 shows an exploded view of the connector apparatus having the wireless module and the connector unit.
Figure 5:
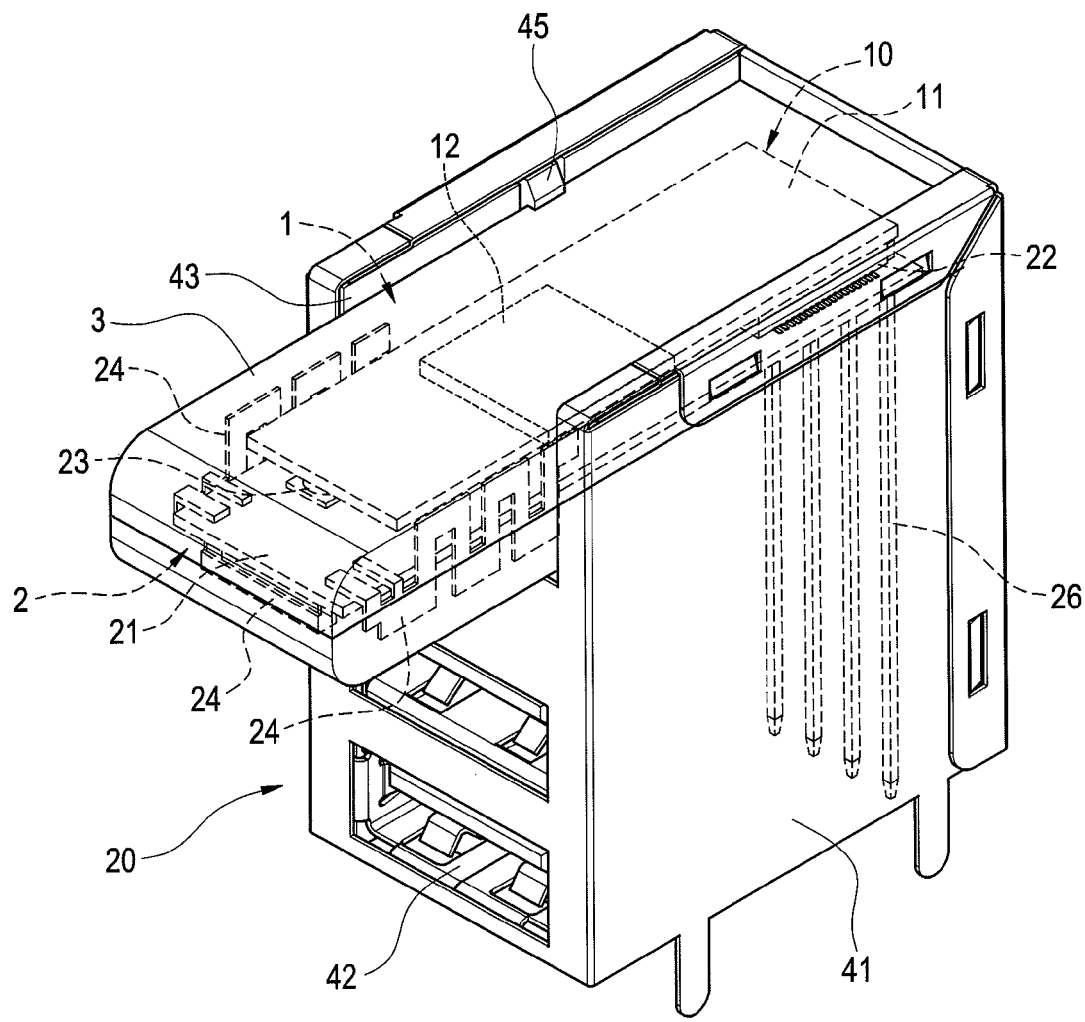
FIG. 5 shows an assembly diagram of the connector apparatus having the wireless module and the connector unit.
Figure 6:
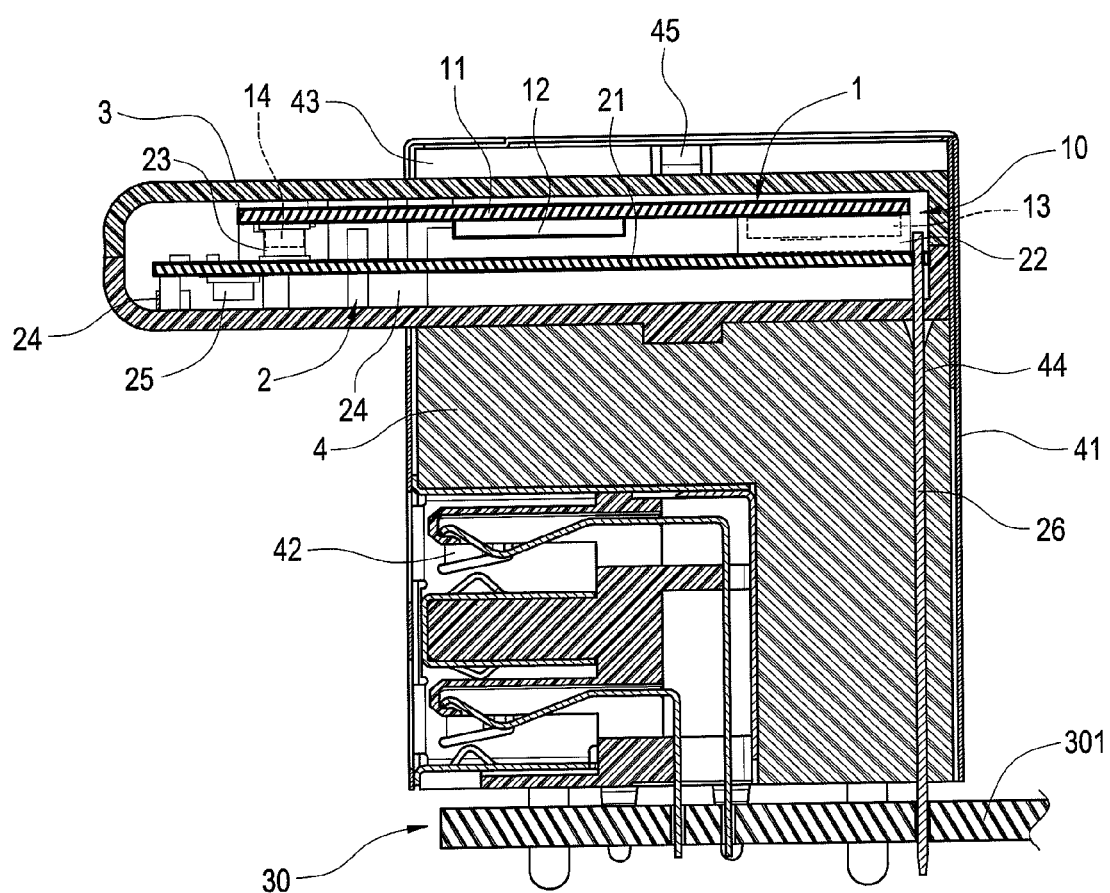
FIG. 6 shows a sectional view of the connector apparatus having the wireless module and the connector unit.

FIG. 4 shows an exploded view of the connector apparatus having the wireless module and the connector unit. FIG. 5 shows an assembly diagram of the connector apparatus having the wireless module and the connector unit. FIG. 6 shows a sectional view of the connector apparatus having the wireless module and the connector unit. The wireless module 10 further includes a casing 3 covering the wireless signal transceiver 1 and the transferring unit 2. The signal transmission parts 26 are extended outside the casing 3. The connector apparatus of the present invention includes the wireless module 10 and a connector unit 20. The wireless module 10 is assembled to the connector unit 20.

The connector unit 20 includes a housing 4, a metal shell 41, and at least an electrical connector 42. The metal shell 41 covers the housing 4. The electrical connector 42 is arranged inside the housing 4. A signal transmission line (not shown in FIG. 4, FIG. 5, and FIG. 6) is plugged into the electrical connector 42. Moreover, the housing 4 includes a groove 43 on the top of the housing 4. The wireless module 10 is assembled to the groove 43. The groove 43 includes a plurality of via holes 44. The signal transmission parts 26 are extended outside the bottom of the housing 4 through the via holes 44. Moreover, the housing 4 further includes two hook-shaped positioning parts 45. The positioning parts 45 are arranged on walls of the groove 43. The wireless module 10 is fixedly assembled to the groove 43 through the positioning parts 45. The connector unit 20 may further include a plurality of the electrical connectors 42 stacked with each other. The electrical connector 42 is one of a universal serial bus (USB) connector, a high definition multimedia interface (HDMI) connector, a displayport connector, a PS/2 connector, an external serial advanced technology attachment (eSATA) connector, a micro universal serial bus (micro-USB) connector, a mini universal serial bus (mini-USB) connector, and an institute of electronical and electronic engineers 1394 (IEEE 1394) connector.

The connector apparatus is electrically fixedly connected to a mainboard 301 of an electronic device 30 after the wireless module 10 is assembled to the connector unit 20. The signal transmission line is plugged into the connector unit 20. The electronic device 30 may wirelessly transmit and receive signals through the wireless module 10.

Figure 7:
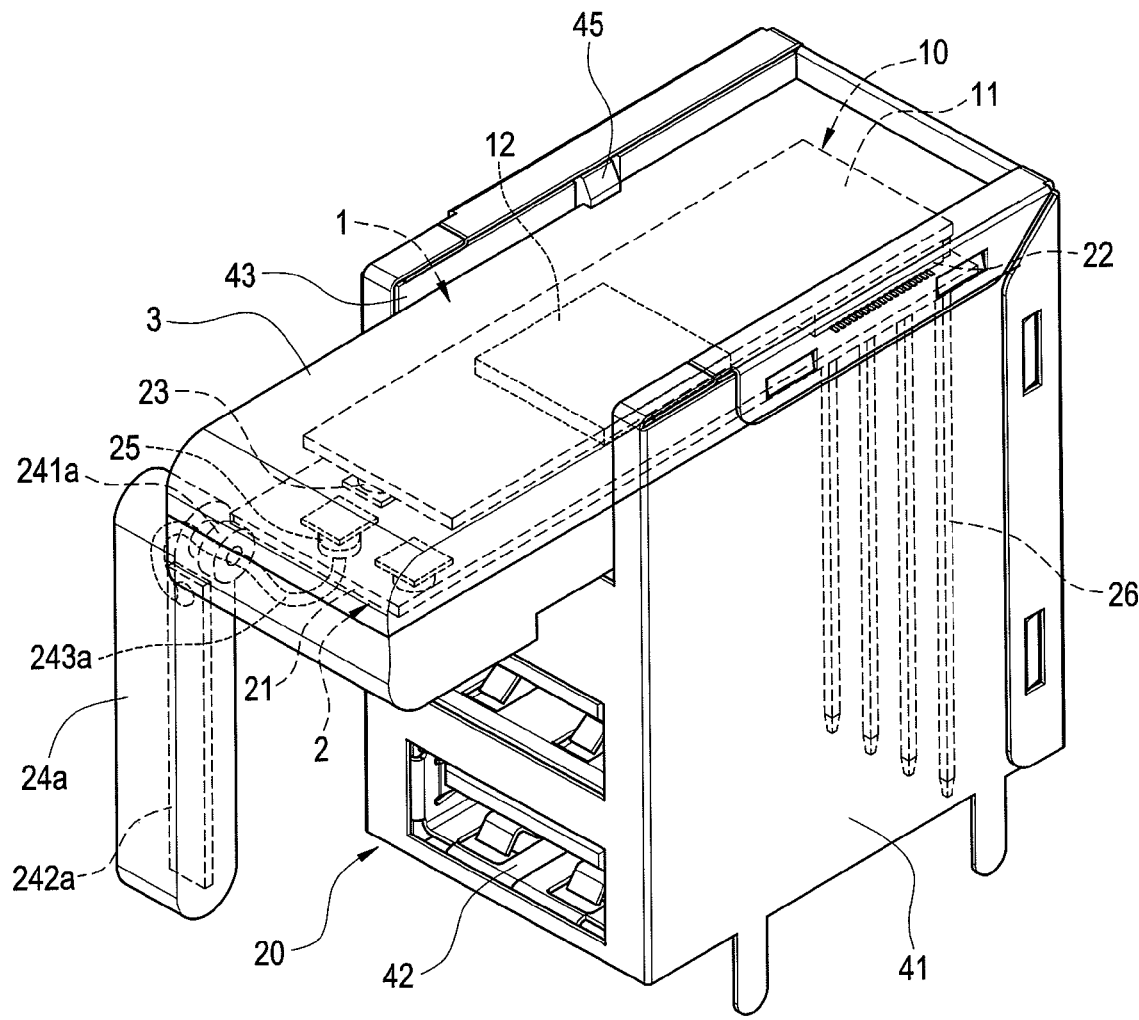
FIG. 7 shows an assembly diagram of another embodiment of the present invention.
Figure 8:
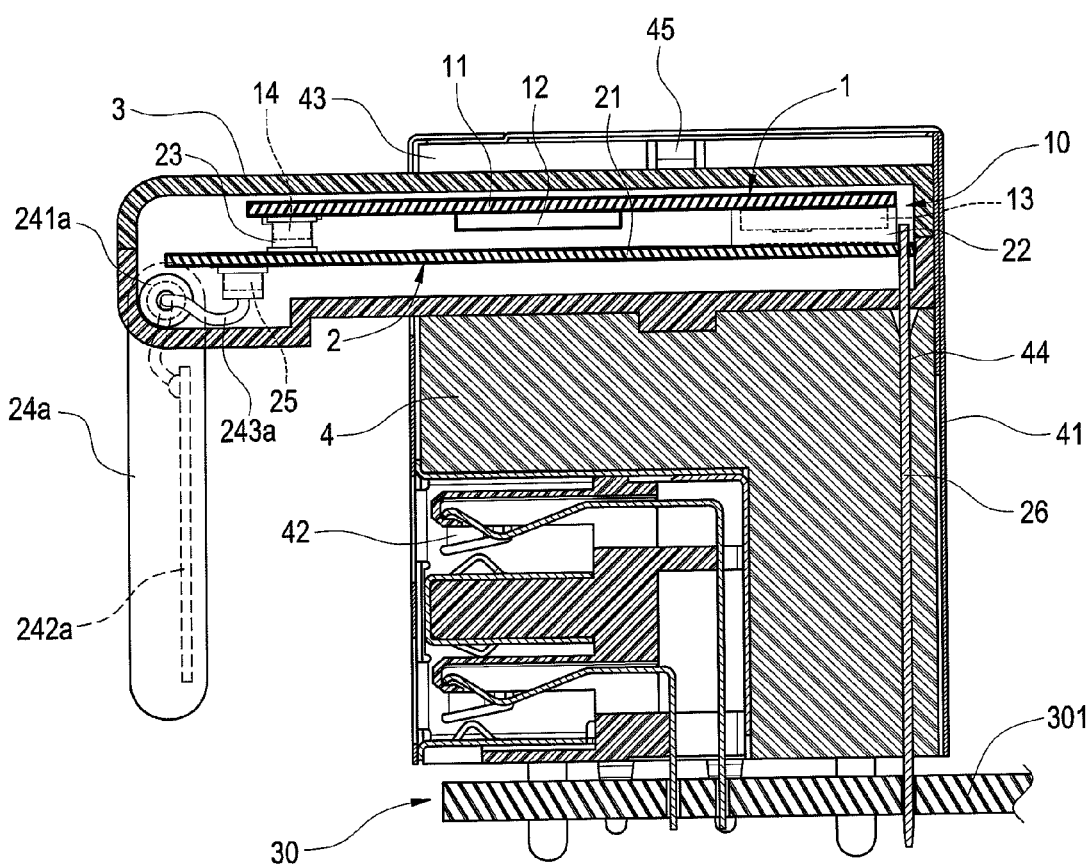
FIG. 8 shows a sectional view of another embodiment of the present invention.
Figure 9:
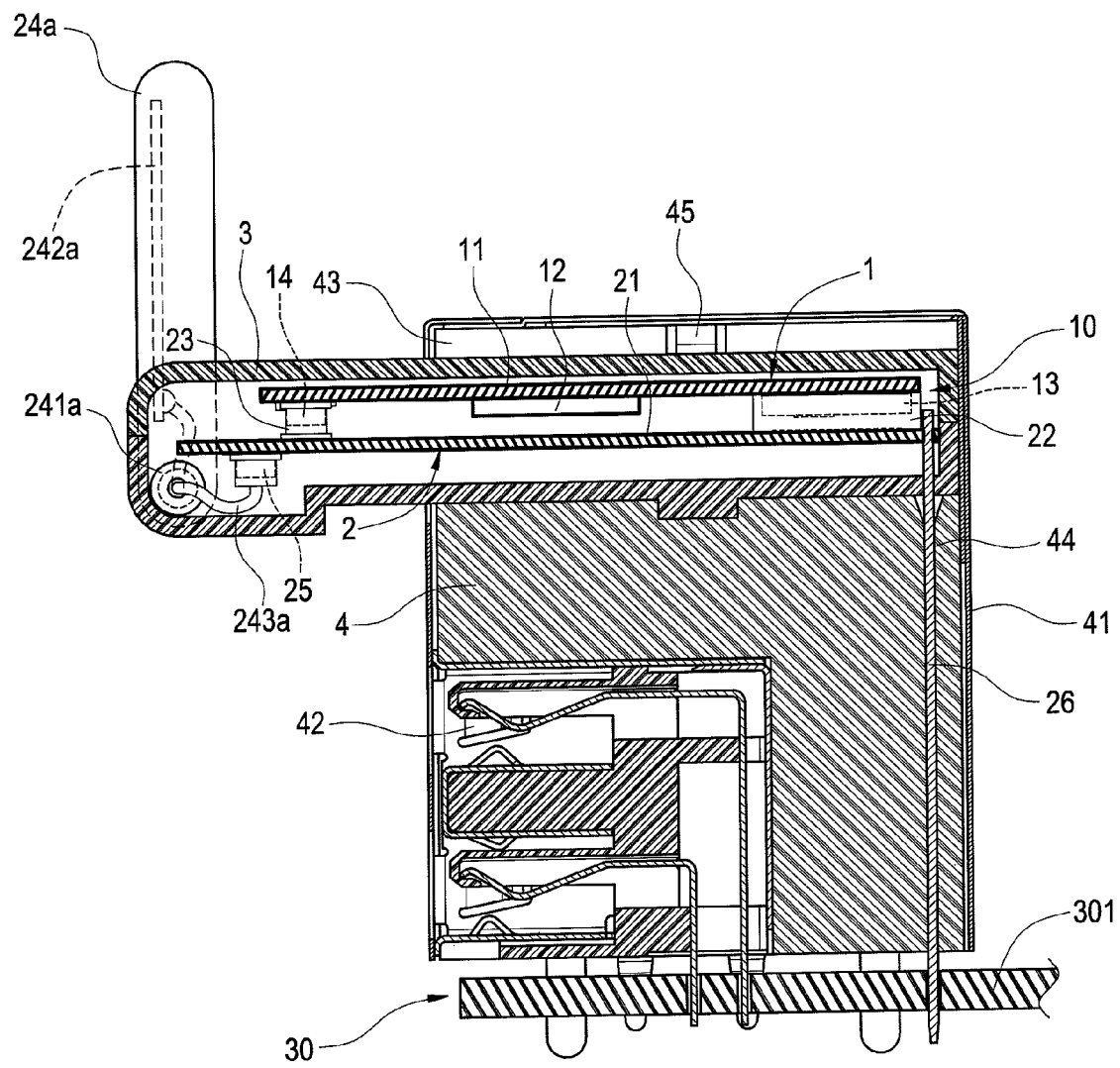
FIG. 9 shows a diagram showing the external antenna is rotatable.

FIG. 7 shows an assembly diagram of another embodiment of the present invention. FIG. 8 shows a sectional view of another embodiment of the present invention. FIG. 9 shows a diagram showing the external antenna is rotatable. The antennas 24 (PIFA) can (but not limited to) be removed from the transferring unit 2 if an external antenna 24a is connected to the transferring unit 2. The external antenna 24a includes a pivot axis 241a, a radiator 242a, and a cable line 243a. The pivot axis 241a is pivotally jointed to the casing 3. The radiator 242a is electrically connected to the second antenna connector 25 through the cable line 243a.

The external antenna 24a is rotatable (i.e. the transmitting-receiving direction of the external antenna 24a is adjustable), so that the performance of transmitting-receiving wireless signals of the wireless module 10 will be adjusted to be better.

Figure 10:
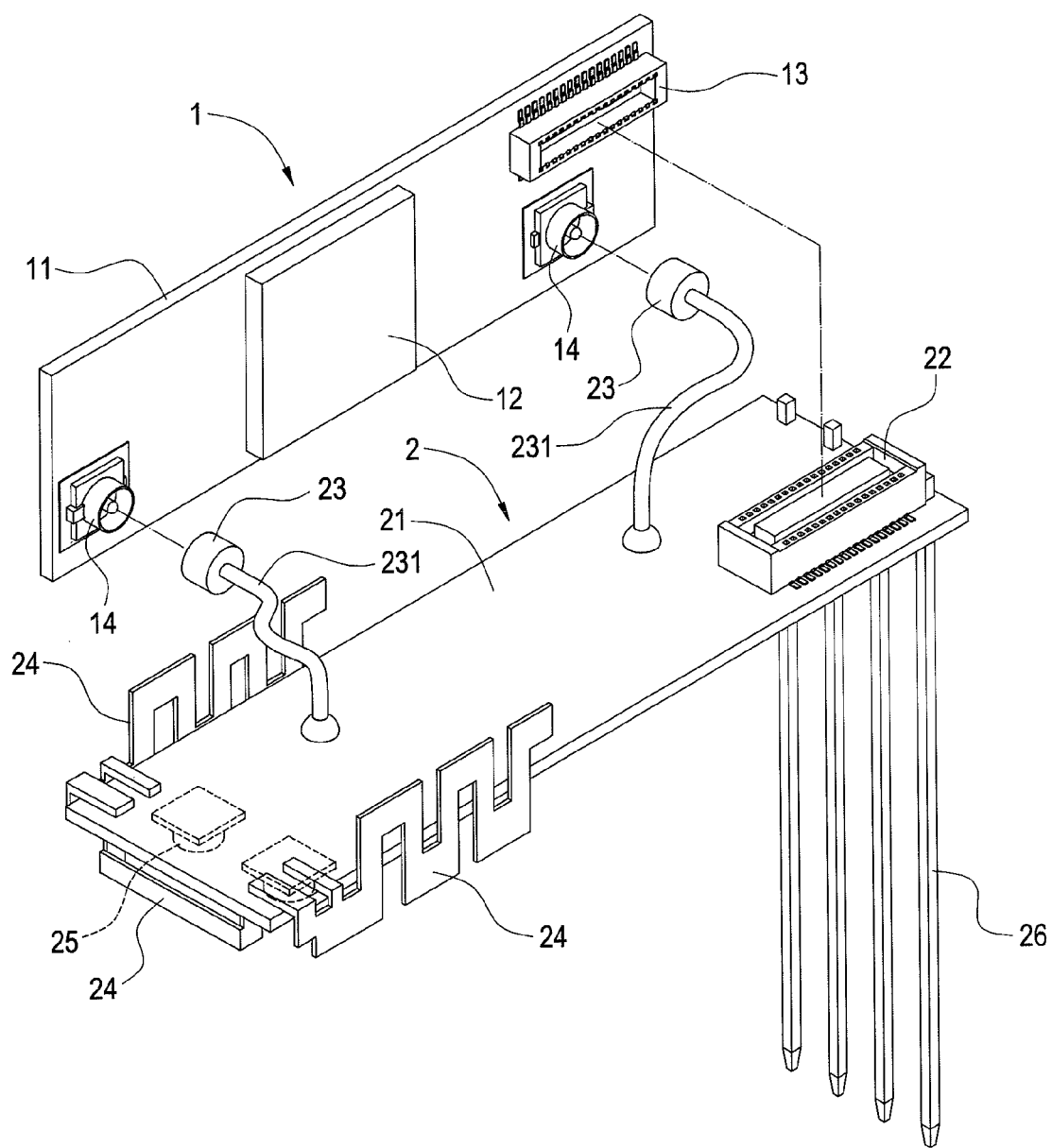
FIG. 10 shows a diagram of another embodiment of the present invention.

FIG. 10 shows a diagram of another embodiment of the present invention. The transferring unit 2 may include a transmission wire 231 (for example but not limited to, if the space and the position for arranging the wireless signal transceiver 1 and the transferring unit 2 is limited) electrically connected between the transferring connector 23 and the second printed circuit board 21. Then the transferring connector 23 is electrically connected to the first antenna connector 14. The signals processed by the wireless signal transceiver 1 will be transmitted to the mainboard of the electronic device through the transferring unit 2. The signals processed by the mainboard of the electronic device will be transmitted to the wireless signal transceiver 1 through the transferring unit 2.

Although the present invention has been described with reference to the preferred embodiment thereof, it will be understood that the invention is not limited to the details thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:
1. A wireless module including:
 a wireless signal transceiver having a first printed circuit board, a wireless signal processing chip, and a first connector, the wireless signal processing chip and the first connector mounted on the first printed circuit board, the first connector electrically connected to the wireless signal processing chip; and
 a transferring unit having a second printed circuit board, a second connector, and a plurality of signal transmission parts, the second connector mounted on the second printed circuit board and electrically connected to the first connector, the signal transmission parts electrically connected to one side of the second printed circuit board,
 wherein the wireless signal processing chip is a wireless fidelity (Wi-Fi) signal processing chip or a Bluetooth signal processing chip;
 wherein the wireless signal transceiver further includes a first antenna connector mounted on the first printed circuit board; the first antenna connector is electrically connected to the wireless signal processing chip; the transferring unit further includes at least a transferring connector electrically connected to the first antenna connector; the transferring connector is mounted on the second printed circuit board or is electrically connected to the second printed circuit board through a transmission wire of the transferring unit; the transferring unit further includes a second antenna connector mounted on another side of the second printed circuit board.

2. The wireless module in claim 1, wherein the transferring unit further includes a plurality of antennas electrically connected to the second printed circuit board.

3. The wireless module in claim 2, wherein the antenna is a planar inverted f antenna (PIFA).

4. The wireless module in claim 3, wherein the signal transmission parts are conductive pins or a bus.

5. The wireless module in claim 4, wherein the wireless module further includes a casing covering the wireless signal transceiver and the transferring unit; the signal transmission parts are extended outside the casing.

6. The wireless module in claim 5, wherein the wireless module further includes an external antenna; the external antenna includes a pivot axis, a radiator, and a cable line; the pivot axis is pivotally jointed to the casing; the radiator is electrically connected to the second antenna connector through the cable line.

7. A connector apparatus including:
 a connector unit having at least an electrical connector and a housing, the electrical connector arranged in the housing, the housing including a groove on the top of the housing; and
 a wireless module assembled to the groove, the wireless module including:
 a wireless signal transceiver having a first printed circuit board, a wireless signal processing chip, and a first connector, the wireless signal processing chip and the first connector mounted on the first printed circuit board, the first connector electrically connected to the wireless signal processing chip; and
 a transferring unit having a second printed circuit board, a second connector, and a plurality of signal transmission parts, the second connector mounted on the second printed circuit board and electrically connected to the first connector, the signal transmission parts electrically connected to one side of the second printed circuit board;
 wherein the wireless signal processing chip is a wireless fidelity (Wi-Fi) signal processing chip or a Bluetooth signal processing chip;
 wherein the wireless signal transceiver further includes a first antenna connector mounted on the first printed circuit board; the first antenna connector is electrically connected to the wireless signal processing chip;

wherein the transferring unit further includes a transferring connector electrically connected to the first antenna connector; the transferring connector is mounted on the second printed circuit board or is electrically connected to the second printed circuit board through a transmission wire of the transferring unit; the transferring unit further includes a second antenna connector mounted on another side of the second printed circuit board.

8. The connector apparatus in claim 7, wherein the transferring unit further includes a plurality of antennas electrically connected to the second printed circuit board.

9. The connector apparatus in claim 8, wherein the antenna is a planar inverted f antenna (PIFA).

10. The connector apparatus in claim 9, wherein the signal transmission parts are conductive pins or a bus.

11. The connector apparatus in claim 10, wherein the wireless module further includes a casing covering the wireless signal transceiver and the transferring unit; the signal transmission parts are extended outside the casing.

12. The connector apparatus in claim 11, wherein the wireless module further includes an external antenna; the external antenna includes a pivot axis, a radiator, and a cable line; the pivot axis is pivotally jointed to the casing; the radiator is electrically connected to the second antenna connector through the cable line.

13. The connector apparatus in claim 12, wherein the connector unit further includes a metal shell covering the housing; the groove includes a plurality of via holes; the conductive pins are extended outside the bottom of the housing through the via holes; the housing further includes two hook-shaped positioning parts; the positioning parts are arranged on walls of the groove; the wireless module is fixedly assembled to the groove through the positioning parts.

14. The connector apparatus in claim 13, wherein the connector unit further includes a plurality of the electrical connectors stacked with each other.

15. The connector apparatus in claim 14, wherein the electrical connector is one of a universal serial bus (USB) connector, a high definition multimedia interface (HDMI) connector, a displayport connector, a PS/2 connector, an external serial advanced technology attachment (eSATA) connector, a micro universal serial bus (micro-USB) connector, a mini universal serial bus (mini-USB) connector, and an institute of electronical and electronic engineers 1394 (IEEE 1394) connector.

\* \* \* \* \*